US008322405B2

(12) United States Patent
Tang et al.

(10) Patent No.: US 8,322,405 B2
(45) Date of Patent: Dec. 4, 2012

(54) HEAT DISSIPATION DEVICE WITH PIVOTABLE FAN

(75) Inventors: Xian-Xiu Tang, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 416 days.

(21) Appl. No.: 12/650,438

(22) Filed: Dec. 30, 2009

(65) Prior Publication Data

US 2011/0100600 A1    May 5, 2011

(30) Foreign Application Priority Data

Nov. 5, 2009  (CN) .......................... 2009 1 0309344

(51) Int. Cl.
*F28F 7/00* (2006.01)
*H05K 7/20* (2006.01)
*H05K 7/00* (2006.01)

(52) U.S. Cl. ............. 165/80.3; 361/679.47; 361/679.48; 361/697

(58) Field of Classification Search .................. 165/80.3; 361/704, 679.48, 679.47, 710, 719
See application file for complete search history.

(56) References Cited

U.S. PATENT DOCUMENTS

| 6,166,906 | A  | * | 12/2000 | Sun et al. ....................... 361/697 |
| 6,236,569 | B1 | * | 5/2001  | McEuen ....................... 361/719 |
| 6,304,445 | B1 | * | 10/2001 | Bollesen ....................... 361/697 |
| 6,464,578 | B1 | * | 10/2002 | Chin et al. ..................... 454/184 |
| 6,640,884 | B1 | * | 11/2003 | Liu ............................ 165/80.3 |
| 7,202,685 | B1 | * | 4/2007  | Bartley et al. ............. 324/750.09 |
| 7,548,422 | B2 | * | 6/2009  | Hsieh ........................... 361/695 |
| 7,821,788 | B2 | * | 10/2010 | Hsiao ........................... 361/695 |
| 8,064,199 | B2 | * | 11/2011 | Lin ............................. 361/695 |
| 2007/0215320 | A1 | * | 9/2007 | Deng et al. .................. 165/80.3 |
| 2007/0256813 | A1 | * | 11/2007 | Ho .............................. 165/80.3 |
| 2008/0041561 | A1 | * | 2/2008 | Zhou et al. .................. 165/80.3 |
| 2008/0121372 | A1 | * | 5/2008 | Zhou et al. .................. 165/80.3 |
| 2010/0101757 | A1 | * | 4/2010 | Xu et al. ...................... 165/80.3 |

* cited by examiner

*Primary Examiner* — Brandon M Rosati
(74) *Attorney, Agent, or Firm* — Altis Law Group, Inc.

(57) ABSTRACT

A heat dissipation device includes a heat conducting board attached to an electronic component mounted on a printed circuit board, a fin unit disposed on the heat conducting board, a fixing module, and a fan secured on the fixing module. The fixing module includes a pivoting post extending through the fin unit, a fan holder spanning over the fin unit and pivotally fixed to the pivoting post, and two fastening members engaging with two opposite ends of the pivoting post and being capable of fixing the fan holder at different positions relative to the fin unit. The fan is fixed to the fan holder of the fixing module and provides airflow towards the fin unit.

13 Claims, 4 Drawing Sheets

HEAT DISSIPATION DEVICE WITH PIVOTABLE FAN

BACKGROUND

1. Technical Field

The disclosure generally relates to heat dissipation devices and, more particularly, to a heat dissipation device incorporating a fan.

2. Description of Related Art

With the fast development of electronic industry, advanced electronic components such as CPUs (central processing units), or GPUs (graphics processing units) are being made with ever faster operating speeds. Greater emphasis is now being laid on increasing the efficiency and effectiveness of heat dissipation devices so as to keep operational temperature of the electronic components within a suitable range. Generally, in order to ensure a temperature of a heat-generating electronic component within a safe threshold level, a heat dissipation device is provided, which comprises a heat sink and a fan combined to the heat sink. The fan is fixed to the heat sink at a predetermined position of a top or a lateral side of the heat sink by a fan holder.

However, such fixed relation of the fan to the heat sink causes the heat dissipation device to be used in a limited way. That is, one type heat dissipation device can only produce one type airflow (for example, the heat sink with the fan fixed on the top of thereof can only have a downward airflow, and the heat sink with the fan fixed on the lateral thereof can only have a lateral-ward airflow). Thus, when the environment of the heat dissipation device is changed, the heat dissipation device also has to be replaced by a different one in order to produce the right airflow suitable for the changed environment, which adversely increases the cost of heat dissipation.

What is needed, therefore, is a heat dissipation device incorporating a fan which can overcome the limitations described above.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
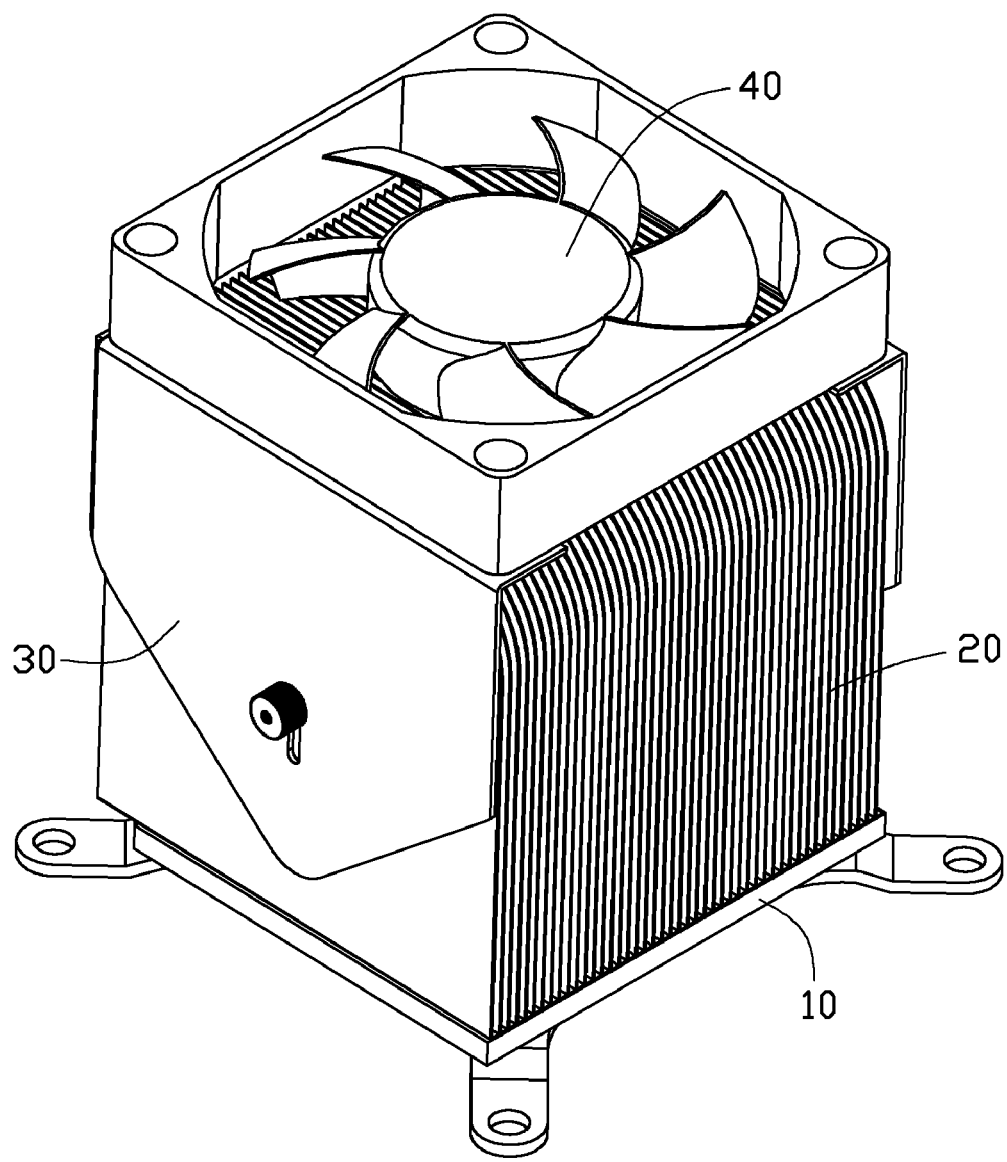
FIG. 1 is an assembled, isometric view of a heat dissipation device in accordance with an embodiment of the disclosure, wherein a fan of the heat dissipation device is located at a first locked position.
Figure 2:
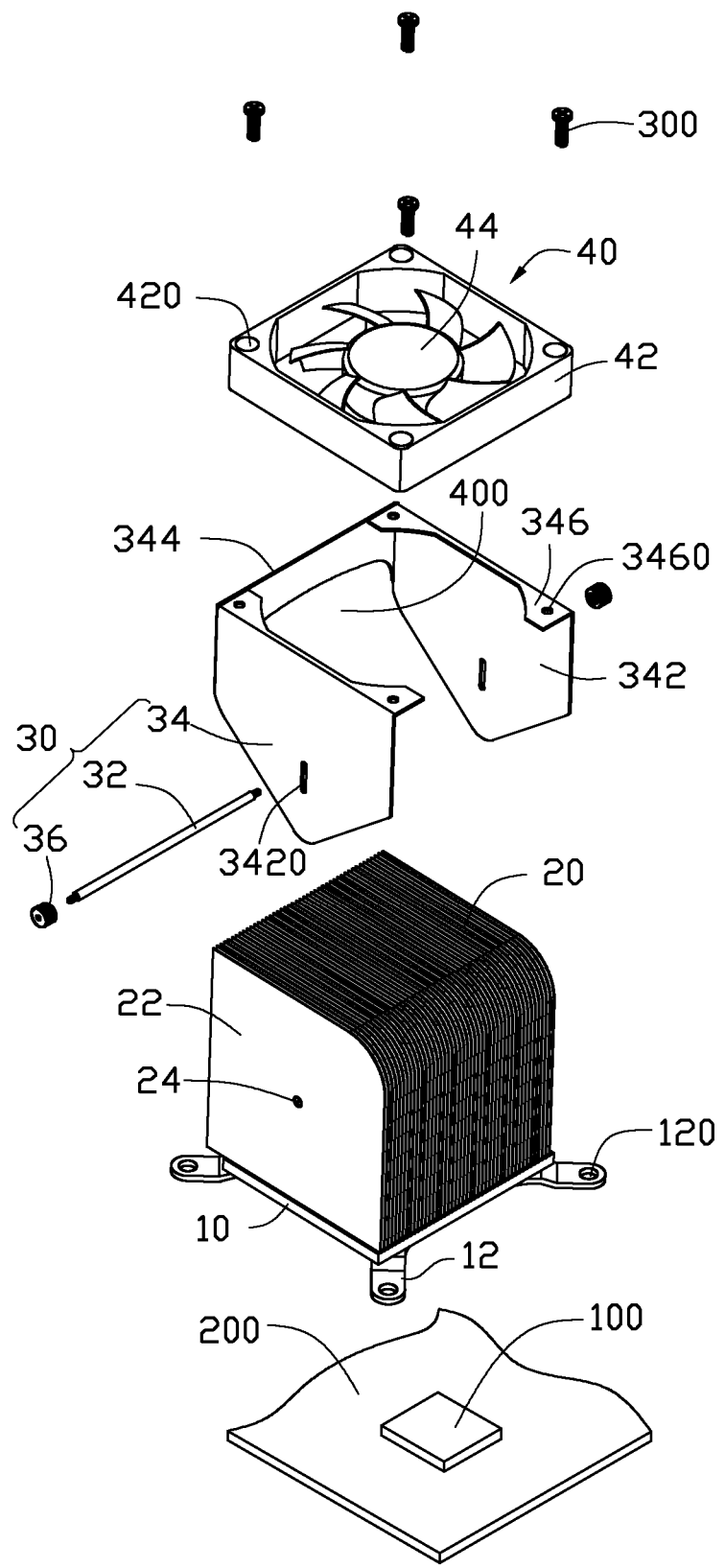
FIG. 2 is an exploded view of the heat dissipation device of FIG. 1, with a printed circuit board having an electronic component mounted thereon.

Referring to FIGS. 1-2, a heat dissipation device in accordance with an embodiment of the disclosure is illustrated. The heat dissipation device dissipates heat from an electronic component 100 such as a CPU (central processing unit), which is mounted on a printed circuit board 200. The heat dissipation device comprises a heat conducting board 10 attached to the electronic component 100, a fin unit 20 disposed on the heat conducting board 10, a fixing module 30 disposed on the heat conducting board 10, and a fan 40 secured on the fixing module 30 to produce an airflow through the fin unit 20.

The heat conducting board 10 is integrally formed of a metallic material with a good thermal conductivity, such as copper, aluminum or an alloy thereof. A bottom face of the heat conducting board 10 is attached to the electronic component 100. Four arms 12 extend outwardly from four corners of the heat conducting board 10, respectively. Each arm 12 defines a through hole 120 at a free end thereof. Four fasteners extend through the through holes 120 of the four arms 12 of the heat conducting board 10 and engage with the printed circuit board 200 for securing the heat dissipation device on the printed circuit board 200, respectively, whereby the heat conducting board 10 can have an intimate contact with the electronic component 100.

The fin unit 20 comprises a plurality of fins 22 parallel to and spaced from each other. The fins 22 are made of metallic sheets and each have a rectangular configuration with an arced corner. The fins 22 are perpendicularly soldered on the heat conducting board 10. The fins 22 are parallel to two opposite lateral sides, i.e., left and right lateral sides, of the heat conducting board 10. A top corner of each fin 22 has a semicircular profile. A plurality of air passages are defined between every two neighboring fins 22 for the airflow from the fan 40 flowing therethrough, to thereby bring heat generated by the electronic component 100 into an ambient environment. An elongated receiving groove 24 is defined at a center of the fin unit 20 for engaging with the fixing module 30. The receiving groove 24 transversely extends through the fin unit 20 and is perpendicular to the fins 22.

The fixing module 30 comprises an elongated pivoting post 32 extending through the fin unit 20, a fan holder 34 spanning over the fin unit 20 and pivotally connected to the pivoting post 32 and two fastening members 36 positioning the fan holder 34 relative to the pivoting post 32. In general, the fixing module 30 is bilaterally symmetrical relative to the fin unit 20.

The pivoting post 32 is correspondingly received in the receiving groove 24 of the fin unit 20. Two opposite ends of the pivoting post 32 extend outwardly from the receiving groove 24, respectively. A periphery of each end of the pivoting post 32 defines plural screw threads for engaging with the fastening member 36. Each of the fastening members 36 threadedly engages with the end of the pivoting post 32 to secure the pivoting post 32 within the fin unit 20. Each of the fastening members 36 is cylindrical. A periphery of each fastening member 36 defines plural saw-teeth for facilitating an operation of the fastening member 36.

The fan holder 34 comprises two pivoting sheets 342 pivotally connected to the two ends of the pivoting post 32 respectively, two supporting beams 346 supporting the fan 40 and a connecting sheet 344 interconnecting the two pivoting sheets 342. The two pivoting sheets 342 are positioned at two opposite lateral sides, i.e., left and right lateral sides, of the fin unit 20, and parallel to the fins 22 of the fin unit 20. A bottom edge of each pivoting sheet 342 has a triangular profile. Each pivoting sheet 342 defines an elongated guiding groove 3420 for the end of the pivoting post 32 extending therethrough. The guiding groove 3420 has a length larger than a diameter of the pivoting post 32 so that the pivoting post 32 could freely slide within the guiding groove 3420. Each pivoting sheet 342 is sandwiched between a corresponding fastening member 36 and the fin unit 20. The two supporting beams 346 extend horizontally from top ends of the two pivoting sheets 342 respectively, and towards each other. Each supporting beam 346 defines two spaced screw holes 3460. Four screws 300 extend through the fan 40 and screw into the screw holes 3460 of the supporting beams 346 for securing the fan 40 to the fan holder 34. An opening 400 is defined between the two supporting beams 346 for providing an air access from the fan 40 to the fin unit 20. The connecting sheet 344 interconnects the two pivoting sheets 342 to secure the two pivoting sheets 342 together. Alternatively, the two supporting beams 346 can directly connect with each other by omitting the connecting sheet 344.

The fan 40 comprises a square frame 42 with a size corresponding to that of the fan holder 34 of the fixing module 30 and an impeller 44 rotatably received in the frame 42.

Figure 3:
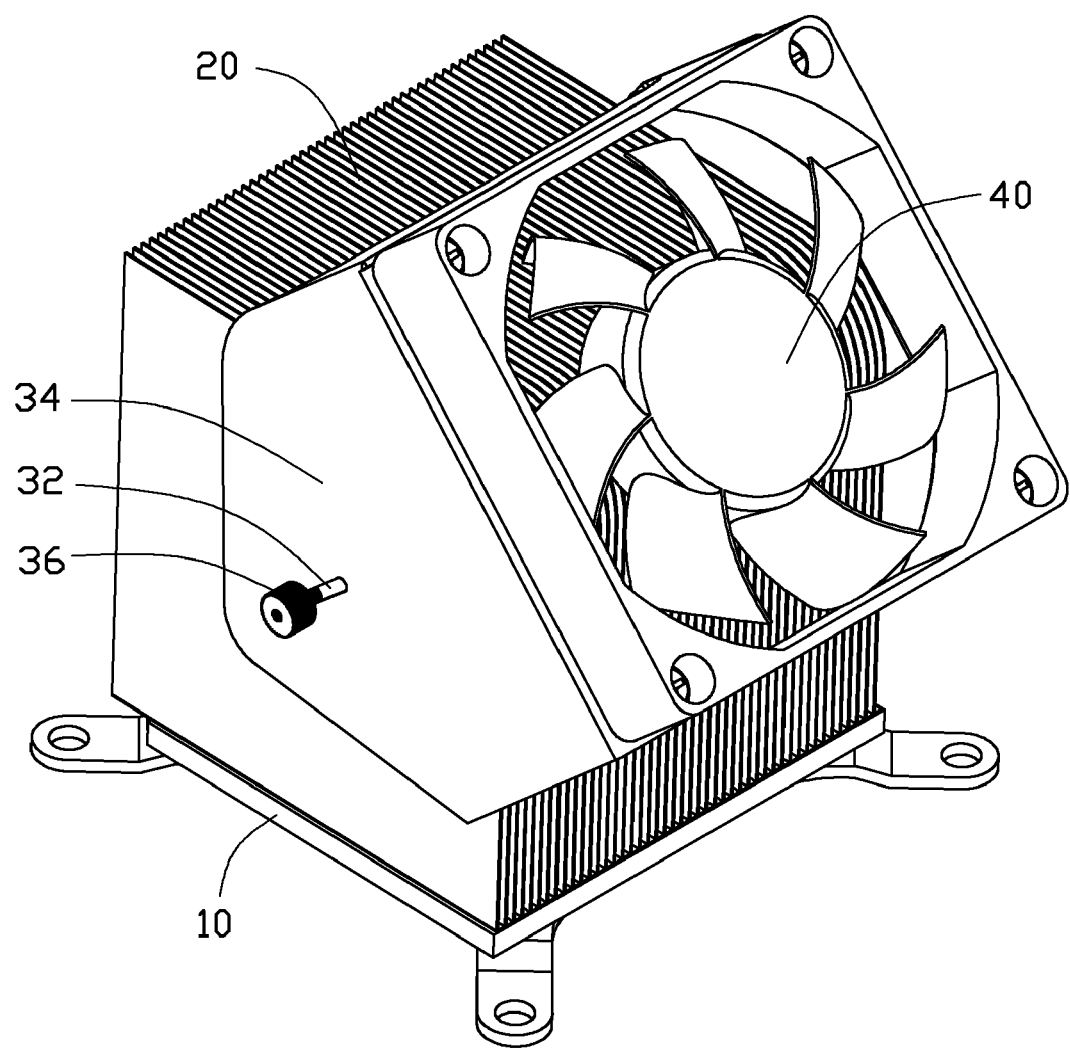
FIG. 3 is another assembled, isometric view of the heat dissipation device of FIG. 1, wherein the fan of the heat dissipation device is rotated between the first locked position and a second locked position.
Figure 4:
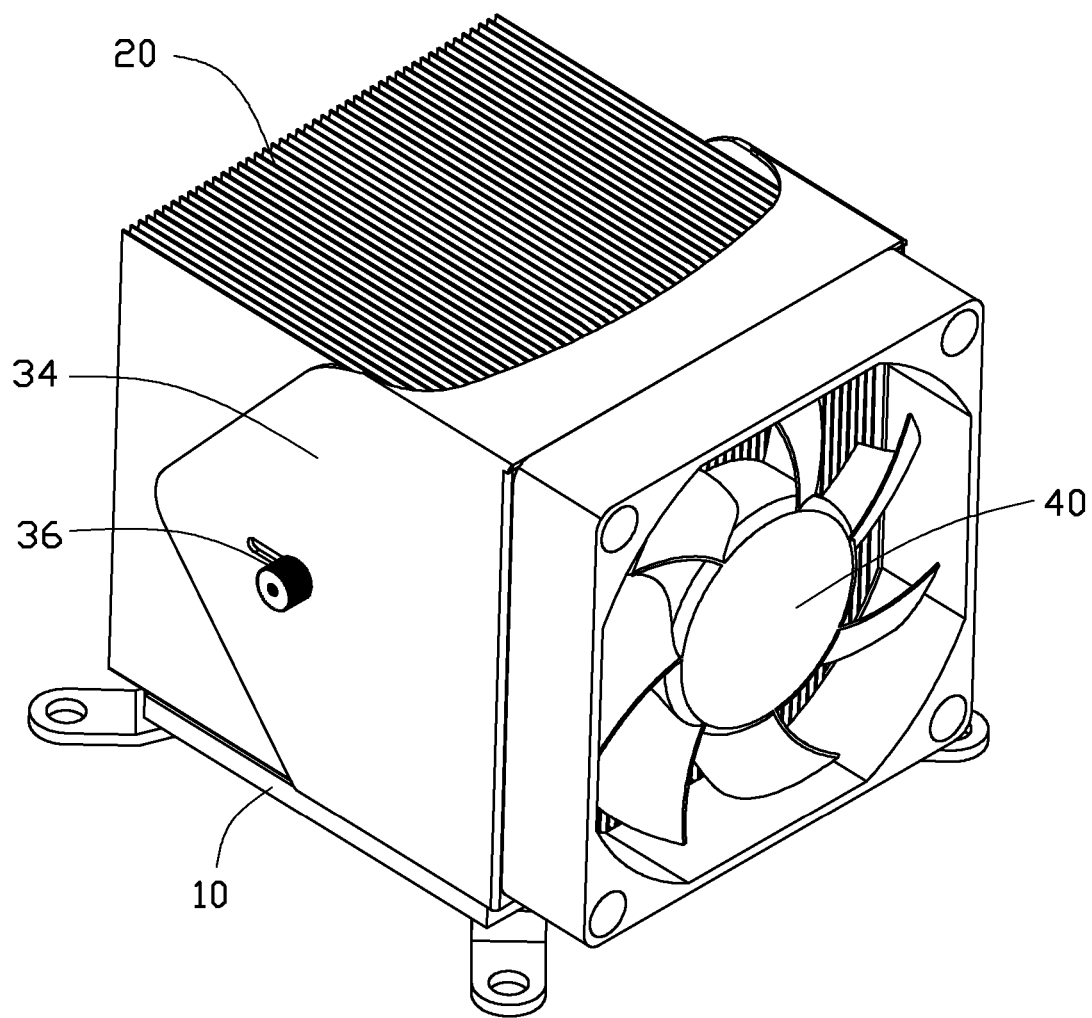
FIG. 4 is yet another assembled, isometric view of the heat dissipation device of FIG. 1, wherein the fan of the heat dissipation device is rotated to the second locked position.

Referring to FIGS. 3-4 also, in operation, when the fixing module 30 is in a first locked state shown in FIG. 1, the two pivoting sheets 342 of the fixing module 30 each are stuck between a corresponding fastening member 36 and the fin unit 20, and the fan holder 34 with the fan 40 is positioned at an original upward position relative to the fin unit 20. In this first locked state, the fan 40 generates a downward airflow which enters the air passages between the fins 22 from the top of the fin unit 20 and exits from other two opposite sides, i.e., front and rear sides of the fin unit 20. To change the position of the fan 40 relative to the fin unit 20, the fastening members 36 are loosen by rotation with respect to the pivoting post 32 in a direction away from the pivoting sheets 342 of the fan holder 34 respectively, with a distance between the two fastening members 36 gradually increasing. When the distance between the two fastening members 36 is long enough to make the pivoting sheets 342 separating from the fastening members 36 and the fin unit 20, the fan holder 34 with the fan 40 can pivot relative to the pivoting post 32 towards a second locked state along a rear-front direction of the fin unit 20. When the fan holder 34 with the fan 40 is pivoted to a position where the fan 40 is located juxtaposed with the fin unit 20 shown in FIG. 4, the fastening members 36 are rotated with respect to the axis of the pivoting post 32 in a direction towards the pivoting sheets 342 of the fan holder 34 and the fin unit 20. Until the two pivoting sheets 342 each are stuck between a corresponding fastening member 36 and the fin unit 20, the fan holder 34 and the fan 40 are fixed relative to the fin unit 20. In the second locked state, the fan 40 generates a lateral-ward airflow which enters the air passages between the fins 22 from a front side of the fin unit 20, and exits from the rear side of the fin unit 20. Thus, the direction of the airflow can be flexibly varied by adjusting the position of the fan 40 relative to the fin unit 20, and the heat dissipation device is accordingly suitable for various environments needing different heat dissipations.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for dissipating heat from an electronic component mounted on a printed circuit board, the heat dissipation device comprising:
   a heat conducting board for being attached to the electronic component;
   a fin unit disposed on the heat conducting board;
   a fixing module comprising a pivoting post extending through the fin unit, a fan holder spanning over the fin unit and pivotally fixed to the pivoting post, and two fastening members engaging with two opposite ends of the pivoting post, the fastening members being capable of fixing the fan holder at different positions relative to the fin unit; and
   a fan fixed to the fan holder of the fixing module;
   wherein the fan holder comprises two supporting beams located over the fin unit, and two pivoting sheets extending downwardly from the two supporting beams and pivotally connected to the two opposite ends of the pivoting post, respectively, and each pivoting sheet defines an elongated guiding groove having the pivoting post extending therethrough, the guiding groove having a length larger than a diameter of the pivoting post and extending in a direction perpendicular to the pivoting post.

2. The heat dissipation device as claimed in claim 1, wherein the fin unit defines a receiving groove extending transversely through the fin unit for receiving the pivoting post therein.

3. The heat dissipation device as claimed in claim 1, wherein the fin unit comprises a plurality of fins arranged upright on the heat conducting board.

4. The heat dissipation device as claimed in claim 3, wherein the fins are parallel to and spaced from each other.

5. The heat dissipation device as claimed in claim 1, wherein the fan is movable along an outer circumference of the fin unit when the fastening members are loosened.

6. The heat dissipation device as claimed in claim 1, wherein the pivoting sheets are pivotable in respect to the pivoting post when the fastening members are loosened.

7. The heat dissipation device as claimed in claim 1, wherein each pivoting sheet is sandwiched between one fastening member and the fin unit.

8. The heat dissipation device as claimed in claim 1, wherein the fan is disposed on the supporting beams.

9. The heat dissipation device as claimed in claim 1, wherein the fan holder further comprises a connecting sheet interconnecting the two pivoting sheets.

10. The heat dissipation device as claimed in claim 1, wherein the fin unit comprises a plurality of fins parallel to and spaced from each other, and the pivoting sheets are parallel to the fins of the fin unit.

11. The heat dissipation device as claimed in claim 1, wherein the fin unit is sandwiched between the two pivoting sheets.

12. The heat dissipation device as claimed in claim 1, wherein the fastening members threadedly engage with the pivoting post.

13. The heat dissipation device as claimed in claim 1, wherein a periphery of each of the fastening members defines a plurality of saw-teeth.

* * * * *